United States Patent [19]
Jarrett et al.

[11] Patent Number: 4,567,388
[45] Date of Patent: Jan. 28, 1986

[54] CLAMP CIRCUIT

[75] Inventors: Robert B. Jarrett, Tempe; W. Eric Main, Mesa; Robert A. Neidorff, Chandler, all of Ariz.

[73] Assignee: Motorola, Inc., Schaumburg, Ill.

[21] Appl. No.: 538,241

[22] Filed: Oct. 3, 1983

[51] Int. Cl.$^4$ ............................................... H03K 5/08
[52] U.S. Cl. ................................... 307/540; 307/549; 307/560
[58] Field of Search ............... 307/200 A, 200 B, 540, 307/549, 550, 560, 567, 318; 361/91

[56] References Cited
U.S. PATENT DOCUMENTS

| | | | |
|---|---|---|---|
| 3,523,198 | 8/1970 | Keller | 307/318 |
| 4,449,158 | 5/1984 | Taira | 307/200 B |
| 4,491,892 | 1/1985 | Lehmann et al. | 361/91 |

*Primary Examiner*—John Zazworsky
*Attorney, Agent, or Firm*—Vincent B. Ingrassia

[57] ABSTRACT

This relates to a circuit for clamping the voltage across first and second terminals (in this case the gate and source electrodes of a power MOSFET) in response to the receipt of a signal indicating a load fault. An input turnaround transistor receives the signal indicative of the fault and generates a current in response thereto which is applied to the base of a switching transistor. When this current exceeds a predetermined value, the switching transistor turns on which in turn causes a buffer circuit including a PNP transistor to turn on. When the buffer circuit turns on, current is drawn through a zener diode which is coupled to the second terminal. Thus, the clamping circuit between the gate and source terminals equals the voltage drop across the zener diode plus that dropped across the buffer circuit plus the saturation voltage of the switching transistor. Resistors are provided in the buffer circuit to provide for a certain amount of adjustment of the clamping voltage.

5 Claims, 4 Drawing Figures

– PRIOR ART –

– PRIOR ART –

CLAMP CIRCUIT

BACKGROUND OF THE INVENTION

This invention relates generally to a voltage clamp circuit and, more particularly, to a circuit for limiting the voltage which appears across the gate and source terminals of a power MOS field effect transistor (MOSFET).

It is well known that automobile manufacturers are tending towards the use of a multiplexed wiring scheme as opposed to the more traditional discrete wiring arrangement. This not only reduces the amount of wiring and connections necessary, but also reduces the labor of troubleshooting and improves long-term reliability (e.g. avoids shorts due to vibrations).

In addition, the automobile industry recognizes the need for diagnostics; i.e., the ability of an onboard computer to sense, for example, when a lamp is burned out or shorted, which lamp is burned out, and immediately inform the driver of the vehicle. Therefore, the multiplexed wiring system must include circuits which are capable of sensing intelligence at each element (e.g. lamp) and distribute this intelligence.

While mechanical switches are used to drive lamps in a discrete wiring system, a multiplexed wiring system requires low current switching such as dash-mounted keyboard or a dusk-on dusk-off sensor, and an electronic power switch such as a TMOS power MOSFET to drive the lamp. Of course, the MOSFET is power dissipation limited; i.e., it can handle a certain amount of power and no more. If the load (lamp) were to become shorted, the entire battery potential would be placed across the terminals of the MOSFET absent certain precautions. Thus, in the case of a load fault, the gate-to-source voltage must be fixed to inherently current limit the MOSFET to prevent it from becoming damaged.

SUMMARY OF THE INVENTION

It is an object of the present invention to provide an improved clamping circuit.

It is a further object of the present invention to provide an improved circuit for placing a predetermined maximum voltage across the gate and source electrodes of a power MOSFET in the event of a load fault.

It is a still further objection of the present invention to provide an improved clamp circuit for limiting the voltage across the gate and source electrodes of a power MOSFET to a predetermined value in the event of a load fault, which circuit includes means for varying the clamping voltage to compensate for variations in the production of MOSFETs.

It is yet another object of the present invention to provide an improved clamping circuit for limiting the voltage across the gate and source electrodes of a power MOSFET, which circuit is configured so as to permit a high impedance to be placed in series with the source which is subject to external trimming by the user.

According to a broad aspect of the invention there is provided a circuit for clamping the voltage across first and second terminals, between which said circuit is coupled, to a desired voltage in response to receipt of an input signal, comprising input means for generating a current in response to receipt of said input signal; switching means coupled to said input means and to said first terminal for turning on when said current reaches a predetermined value and producing a first voltage drop thereacross; buffer means coupled to said switching means and to a first source of supply voltage for turning on and providing a second voltage drop thereacross when said switching means turns on; and controlled voltage drop circuit means coupled between said second terminal and said buffer means for conducting current to produce a third voltage drop thereacross in series with said first and second voltage drops when said switching means and said buffer means are on.

The above and other objects, features and advantages of the present invention will be more clearly understood from the following detailed description taken in conjunction with the accompanying drawings, in which:

DESCRIPTION OF THE PREFERRED EMBODIMENT

Figure 1:
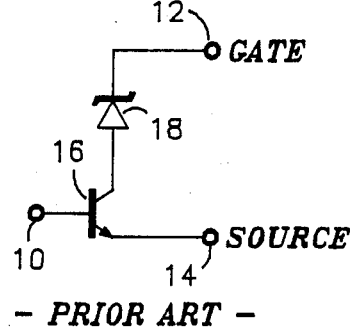
FIGS. 1 and 2 are schematic diagrams of clamping circuits in accordance with the prior art.
Figure 2:
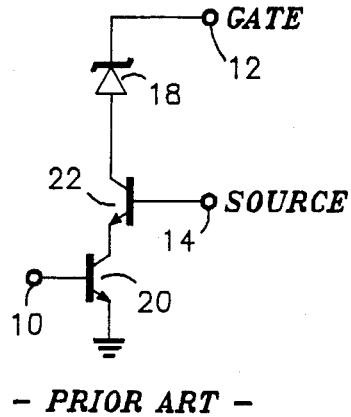

FIGS. 1 and 2 are schematic diagrams of clamping circuits which are known in the prior art. In each case, a load fault is indicated by a predetermined voltage appearing at input terminal 10. Referring first to FIG. 1, the circuit includes terminals 12 and 14 which are coupled across the gate and source electrodes of a power MOSFET. The circuit includes an NPN transistor 16 and a zener diode 18. Transistor 16 has a base coupled to input terminal 10, an emitter coupled to terminal 14 and a collector coupled to the anode of zener diode 18. The cathode of zener diode 18 is coupled to terminal 12. When the voltage at input terminal 10 reaches a predetermined voltage, transistor 16 will turn on. Thus, the voltage between terminals 12 and 14 will be limited to the voltage drop across zener diode 18 plus the saturation voltage ($v_{CEsat}$) of NPN transistor 16. The problem with this circuit is that all of the switching drive current plus all of the load clamping current flows into terminal 14 which is coupled to the source electrode of the power MOSFET. Unfortunately, as stated previously, it is desirable to put a trimming impedance in series with the source in order to be able to fine tune the clamping voltage. Since all of the current is flowing into the source, this will result in an unknown and uncontrolled current flow through the trimming impedance.

This problem is solved in the prior art circuit shown in FIG. 2. In this circuit, input terminal 10 is coupled to the base of an NPN transistor 20 having an emitter coupled to ground. A second NPN transistor 22 has a base coupled to terminal 14 (the source electrode of the power MOSFET), an emitter coupled to the collector of transistor 20 and a collector coupled to the anode of zener diode 18. In this case, the clamping voltage established between terminals 12 and 14 is equal to the zener diode voltage plus the saturation voltage of transistor 22 ($V_{CEsat}$) minus the base-emitter voltage of transistor 22. As should be apparent, source terminal 14 is not as heavily loaded as was the case in the previously described circuit. Unfortunately, the circuit shown in FIG. 2 will not function (i.e., the clamp cannot turn on) when the source terminal is at a potential equal to or below ground.

Figure 3:
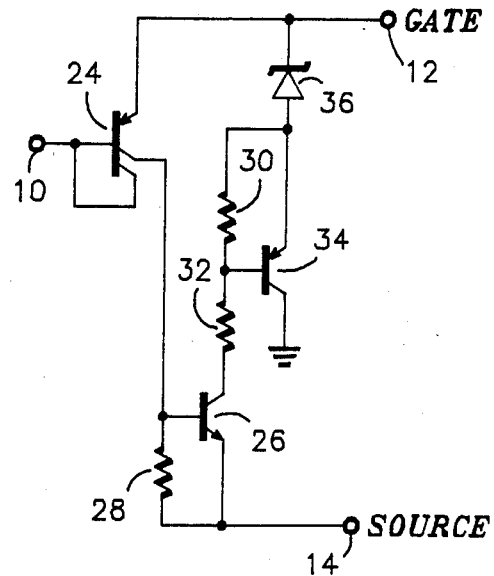
FIG. 3 is a schematic diagram of a first embodiment of the inventive clamping circuit.

FIG. 3 illustrates a first embodiment of the inventive clamping circuit. Input terminal 10 is coupled to the base and to a first collector of a PNP turnaround transistor 24. The emitter of transistor 24 is coupled to gate terminal 12. The second collector of transistor 24 is coupled to the base of an NPN switching transistor 26 and to source terminal 14 via resistor 28. The emitter of switching transistor 26 is coupled to source terminal 14 while its collector is coupled to a first end of resistor 32. A buffer PNP transistor 34 has a collector coupled to ground, a base coupled to a second end of resistor 32 and to a first end of resistor 30, and an emitter coupled to a second end of resistor 30 and to a first end of voltage drop circuitry (e.g. the anode of zener diode 36). A second end of voltage drop circuitry (e.g. the cathode of zener diode 36) is coupled to gate terminal 12.

In practice, when a load fault occurs, the voltage at input terminal 10 will immediately assume a value which results in current being pulled out of the base of transisor 24. This causes current to be supplied to the base of NPN switching transistor 26 via the second collector of transistor 24. When the current flowing into the base of transistor 26 reaches a threshold ($V_{BE}/R_{28}$ where $V_{BE}$ is the base-emitter voltage of transistor 26 and $R_{28}$ is the resistance of resistor 28) transistor 26 will turn on pulling base current from the base of buffer transistor 34 through resistor 32 causing transistor 34 to turn on. This in turn will cause current to flow through zener diode 36 thus loading down gate terminal 12.

Current will be pulled out of gate terminal 12 until NPN transistor 26 saturates thus fixing the collector voltage of transistor 26 to approximately the voltage at source terminal 14.

Resistors 30 and 32 form a voltage divider which establishes the base-emitter voltage of transistor 34 at approximately 0.9 to 1.0 volts. Thus, by varying the values of resistors 30 and 32, a course adjustment is possible to compensate for processing variations and unique vendor requirements. Fine tuning may still be accomplished through the use of a customer trimmed resistor (not shown) in series with the source.

When zener diode 36 is on, current can only flow through resistor 30 or transistor 34. When transistor 34 turns on, i.e., the clamping circuit is brought into operation, the total clamping voltage will equal the voltage drop across zener diode 36 plus the saturation voltage of transistor 26 plus the base-emitter voltage of transistor 34 multiplied by the total resistance of resistors 30 and 32 divided by the resistance of resistor 30.

To reduce loading effects on zener diode 36 when transistor 34 is on the verge of turning on, resistors 30 and 32 should be made reasonably high. Unfortunately, this means that the base of transistor 34 is at a high impedance reducing its turn-on speed. The embodiment shown in FIG. 4 solves this problem.

Figure 4:
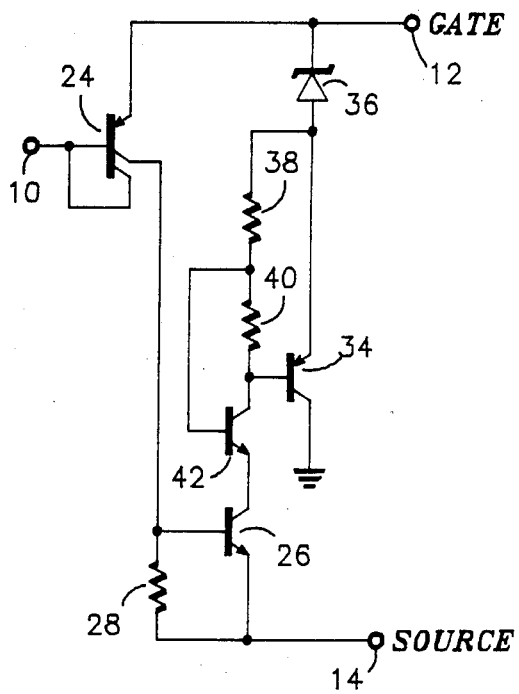
FIG. 4 is a schematic diagram of a second embodiment of the present invention.

Referring to FIG. 4, where like elements have been denoted with like reference numerals, resistors 30 and 32 (shown in FIG. 3) have been replaced by resistors 38 and 40 and an additional NPN transistor 42 having a collector coupled to the base of transistor 34, an emitter coupled to the collector of transistor 26 and a base coupled to the junction of resistors 38 and 40. The base of transistor 34 is coupled to a first end of resistor 40, and the anode of zener diode 36 coupled to a first end of resistor 38. The second ends of resistors 38 and 40 are coupled to each other and to the base of transistor 42.

This circuit operates as follows. If we assume that transistor 34 is on, a fraction of the $V_{BE}$ of transistor 34 will be developed across resistor 38 and the remainder will be developed across resistor 40. Since transistor 42 must be on in order for transistor 34 to be on, a voltage of $V_{BE}$ must be present across the base-emitter junction of transistor 32. Furthermore, the base of transistor 42 must be a fraction of $V_{BE}$ below the emitter of transistor 34 since, as already mentioned, the voltage drop across resistor 38 will be a fraction of the base-emitter voltage of transistor 34. Thus, the clamping voltage now becomes the voltage dropped across zener diode 36 plus the fraction of the base-emitter voltage of transistor 34 dropped across resistor 38 plus the base-emitter voltage of transistor 42 plus the saturation voltage of transistor 26. If, for example, resistor 38 were chosen to be extremely high with respect to resistor 40, the voltage dropped across resistor 38 and transistor 42 would be equal to approximately $2V_{BE}$. If, on the other hand, the resistance of resistor 38 were to approach zero, the total drop between the anode of zener diode 36 and the collector of transistor 26 would be a single $V_{BE}$. Thus, a trimming voltage equal to approximately the base-emitter voltage of a transistor (approximately 0.7 volts) is provided for adjusting the clamping voltage. The speed of the circuit has been increased since there is no major resistance between drive transistor 24 and the base of transistor 34.

The above description is given by way of example only. Changes in form and details may be made by one skilled in the art without departing from the scope of the invention as defined by the appended claims.

We claim:

1. A circuit for clamping the voltage across first and second terminals, between which said circuit is coupled, to a desired voltage in response to receipt of an input signal, comprising:
   input means for generating a current in response to receipt of said input signal;
   switching means coupled to said input means and to said first terminal for turning on when said current reaches a predetermined value and producing a first voltage drop thereacross;
   buffer means coupled to said switching means and to a first source of supply voltage for turning on and providing a second voltage drop thereacross when said switching means turns on, said buffer means including
   a PNP buffer transistor having a collector coupled to a first source of supply voltage, an emitter, and a base;
   first and second series coupled resistors having a first end coupled to the base of said buffer transistor and having a second end; and
   an additional NPN transistor having an emitter coupled to said switching means, a collector coupled to the base of said buffer transistor, and a base coupled to the junction of said first and second series coupled resistors; and
   controlled voltage drop circuit means coupled between said second terminal, the emitter of said buffer transistor and said second end of said series coupled resistors for conducting current to produce a third voltage drop thereacross in series with said first and second voltage drop when said switching means and said buffer means are on, the emitter of said buffer transistor being coupled to said controlled voltage drop circuit means.

2. The circuit according to claim 1 wherein said input means comprises transistor means having a control electrode coupled to receive said input signal for conducting current to said switching means.

3. A circuit according to claim 2 wherein said transistor means comprises a PNP input transistor having a base coupled to receive said input signal, an emitter coupled to said second terminal and at least one collector coupled to said switching means.

4. A circuit according to claim 3 wherein said switching means comprises:

an NPN switching transistor having a base coupled to the collector of said input transistor, an emitter coupled to said first terminal and a collector coupled to said buffer means; and impedance means coupled between the base of said NPN switching transistor and said first terminal.

5. A circuit according to claim 3 wherein said controlled voltage drop circuit means comprises a zener diode having an anode coupled to said buffer means and a cathode coupled to said second terminal.

* * * * *